（12）United States Patent
Hwang et al.

(10) Patent No.: US 12,393,224 B2
(45) Date of Patent: Aug. 19, 2025

(54) BENDABLE DISPLAY DEVICE

(71) Applicant: LG Display Co., Ltd., Seoul (KR)

(72) Inventors: Yong-Ik Hwang, Paju-si (KR); Chang-Hee Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 248 days.

(21) Appl. No.: 18/348,806

(22) Filed: Jul. 7, 2023

(65) Prior Publication Data

US 2024/0019893 A1    Jan. 18, 2024

(30) Foreign Application Priority Data

Jul. 12, 2022    (KR) ........................ 10-2022-0085524

(51) Int. Cl.
G06F 1/16    (2006.01)
H05K 5/00    (2006.01)
H05K 5/02    (2006.01)

(52) U.S. Cl.
CPC ......... G06F 1/1601 (2013.01); H05K 5/0018 (2022.08); H05K 5/0221 (2013.01); *G06F 2200/1612* (2013.01)

(58) Field of Classification Search
CPC combination set(s) only.
See application file for complete search history.

(56) References Cited

U.S. PATENT DOCUMENTS

| 9,978,293 | B2 * | 5/2018 | Cho ...................... G06F 1/1652 |
| 11,798,439 | B2 * | 10/2023 | Oh ............................ G09F 9/35 |
| 11,805,610 | B2 * | 10/2023 | Pyo ...................... G06F 1/1652 |
| 12,096,576 | B2 * | 9/2024 | Cho ...................... G06F 1/1601 |
| 12,222,767 | B2 * | 2/2025 | Pyo ...................... G06F 1/1656 |
| 2015/0296641 | A1 * | 10/2015 | Song ...................... F16M 11/18 361/679.01 |
| 2016/0040764 | A1 * | 2/2016 | Park ........................ G09F 9/301 361/679.01 |
| 2017/0193863 | A1 * | 7/2017 | Cho ............................ G06F 1/16 |
| 2018/0063978 | A1 * | 3/2018 | Kim ........................ F16M 11/10 |
| 2018/0226001 | A1 * | 8/2018 | Chen .................. G09F 15/0031 |
| 2021/0026416 | A1 * | 1/2021 | Magi ..................... G06F 1/1652 |
| 2023/0397350 | A1 * | 12/2023 | Yoon .................... H05K 5/0217 |

FOREIGN PATENT DOCUMENTS

KR    20150004193 A    1/2015

* cited by examiner

*Primary Examiner* — Sagar Shrestha
(74) *Attorney, Agent, or Firm* — Seed Intellectual Property Law Group LLP

(57) ABSTRACT

A bendable display device includes a display module; and a bending system on a rear surface of the display module and configured to change the display module between a flat mode and a bended mode, wherein the bending system includes a fixed plate, a rotating plate, and first and second horizontal bars, wherein the rotating plate has a pinion portion, and wherein the first and second horizontal bars have first and second rack portions engaged with the pinion portion at one ends thereof, respectively.

11 Claims, 17 Drawing Sheets

BENDABLE DISPLAY DEVICE

CROSS-REFERENCE TO RELATED APPLICATION

The present application claims the priority of Korean Patent Application No. 10-2022-0085524 filed on Jul. 12, 2022, which is hereby incorporated by reference in its entirety.

BACKGROUND

Technical Field

The present disclosure relates to a display device, and more particularly, to a bendable display device capable of switching between a flat mode and a bended mode.

Description of the Related Art

An electroluminescent display device is one of flat panel display devices. It has a wide viewing angle as compared with a liquid crystal display device because it is self-luminous. It is also thin, light weight, and low in power consumption because a backlight unit is not necessary. In addition, an electroluminescent display device may be driven by low voltages of direct current (DC) and has a fast response time. An electroluminescent display device is also resistant to external impacts and may be used in a wide range of temperatures because its components are solids. An electroluminescent display device may also be manufactured at low cost.

Recently, a bendable display device, which can be freely bended and unfolded by forming components of the electroluminescent display device on a flexible substrate, has been highly demanded.

The bendable display device can switch between a flat mode and a bended or curved mode according to the user's needs. Here, depending on the switching method, the bendable display device can be divided into a grip method in which force is applied by directly holding a display module with a hand and a non-grip method in which force is applied using a lever or the like.

BRIEF SUMMARY

Accordingly, embodiments of the present disclosure are directed to a bendable display device that substantially obviates one or more of the problems due to the limitations and disadvantages of the related art.

The inventors have realized that the gripping and non-gripping bendable display devices have different structures. Further this is inconvenient because the user can change the mode of the bendable display device by only one technique.

In addition, the gripping bendable display device has problems that there is a high possibility of damage to a display panel, a uniform curvature implementation is lowered, and a flat surface implementation is reduced. On the other hand, the non-gripping bendable display device has problems that convenience for a curvature implementation is reduced and a display module shakes when switching to a flat mode. The inventors provide herein solutions to these problems they have identified.

More specifically, an object of the present disclosure is to provide a bendable display device capable of selectively applying a grip method and a non-grip method.

The features and aspects of the present disclosure are not limited to those described above. Additional features and advantages of the disclosure will be set forth in the description which follows, and in part will be apparent to those skilled in the art from the description or may be learned by practice of the disclosure. These and other advantages of the disclosure may be realized and attained by the structure particularly pointed out in, or derivable from, the written description, claims hereof, and the appended drawings.

To achieve these and other advantages of the present disclosure and in accordance with the purpose of the disclosure, as embodied and broadly described herein, a bendable display device includes a display module; and a bending system on a rear surface of the display module and configured to change the display module between a flat mode and a bended mode, wherein the bending system includes a fixed plate, a rotating plate, and first and second horizontal bars, wherein the rotating plate has a pinion portion, and wherein the first and second horizontal bars have first and second rack portions engaged with the pinion portion at one ends thereof, respectively.

It is to be understood that both the foregoing general description and the following detailed description are explanatory and by way of examples and are intended to provide further explanation of the disclosure as claimed without limiting its scope.

BRIEF DESCRIPTION OF THE SEVERAL VIEWS OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Figure 1:
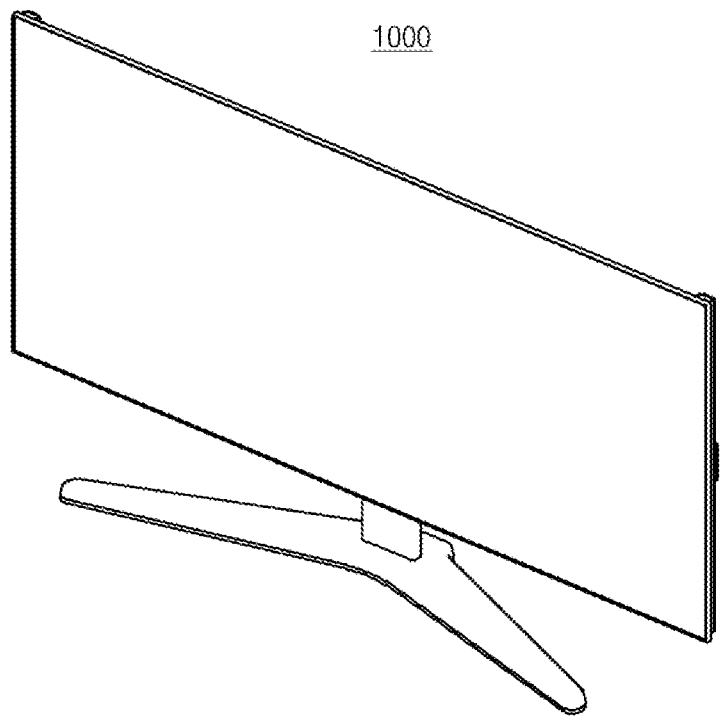
FIG. 1 is a view schematically illustrating a bendable display device in a flat mode according to an example embodiment of the present disclosure from the front side.

Advantages and features of the present disclosure and methods for achieving them will be made clear from embodiments described in detail below with reference to the accompanying drawings. The present disclosure can, however, be implemented in many different forms and should not be construed as being limited to the embodiments set forth herein, and the embodiments are provided such that this disclosure will be thorough and complete and will fully convey the scope of the present disclosure to those skilled in the art to which the present disclosure pertains.

Shapes, sizes, ratios, angles, numbers, and the like disclosed in the drawings for describing the embodiments of the present disclosure are illustrative, and thus the present disclosure is not limited to the illustrated matters. The same reference numerals refer to the same components throughout this disclosure. Further, in the following description of the present disclosure, when a detailed description of a known related art is determined to unnecessarily obscure the gist of the present disclosure, the detailed description thereof will be omitted herein. When terms such as "including," "having," "consisting of," and the like mentioned in this disclosure are used, other parts can be added unless the term "only" is used herein. When a component is expressed as being singular, being plural is included unless otherwise specified.

In analyzing a component, an error range is interpreted as being included even when there is no explicit description.

In describing a positional relationship, for example, when a positional relationship of two parts is described as being "on," "above," "below," "next to," or the like, unless "immediately" or "directly" is not used, one or more other parts can be located between the two parts.

In describing a temporal relationship, for example, when a temporal predecessor relationship is described as being "after," "subsequent," "next to," "prior to," or the like, unless "immediately" or "directly" is not used, cases that are not continuous can also be included.

Although the terms first, second, and the like are used to describe various components, these components are not substantially limited by these terms. These terms are used only to distinguish one component from another component. Therefore, a first component described below can substantially be a second component within the technical spirit of the present disclosure.

Features of various embodiments of the present disclosure can be partially or entirely united or combined with each other, technically various interlocking and driving are possible, and each of the embodiments can be independently implemented with respect to each other or implemented together in a related relationship.

Reference will now be made in detail to embodiments of the present disclosure, examples of which are illustrated in the accompanying drawings.

Figure 2:
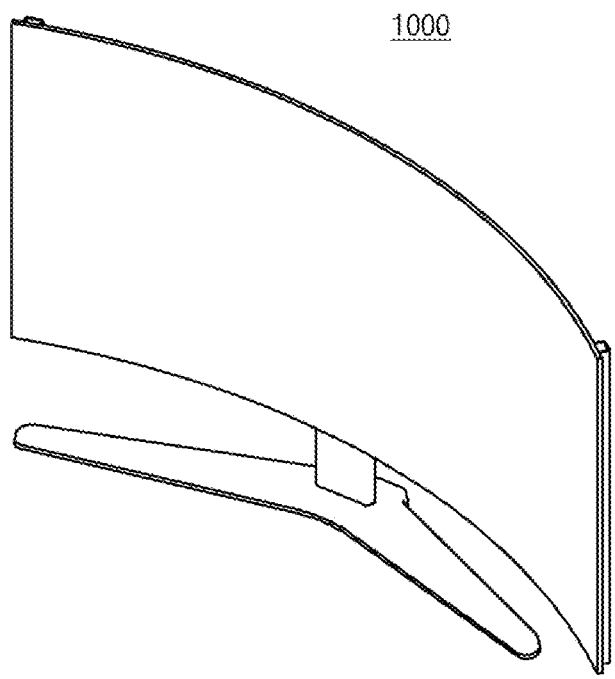
FIG. 2 is a view schematically illustrating a bendable display device in a bended mode according to an example embodiment of the present disclosure from the front side.

FIG. 1 is a view schematically illustrating a bendable display device in a flat mode according to an example embodiment of the present disclosure from the front side. FIG. 2 is a view schematically illustrating the bendable display device in a bended mode according to an example embodiment of the present disclosure from the front side.

In FIG. 1 and FIG. 2, the bendable display device 1000 according to an example embodiment of the present disclosure may be used in a flat mode or a bended mode depending on the user's purpose or convenience.

Specifically, as shown in FIG. 1, the bendable display device 1000 can be used in the flat mode while playing a game, watching a movie, or in an office area. Then, to enhance a sense of reality and immersion, as shown in FIG. 2, the bendable display device 1000 can be switched and used in the bended mode. In this case, for example, the bendable display device 1000 in the bended mode can have the highest sense of reality and immersion at a curvature of up to 800R (an arc with a radius of 800 mm).

The bendable display device 1000 according to an example embodiment of the present disclosure may include a bending system for switching between the flat mode and the bended mode. The bendable display device 1000 according to an example embodiment of the present disclosure having a bending system will be described with reference to FIGS. 3 to 5.

Figure 3:
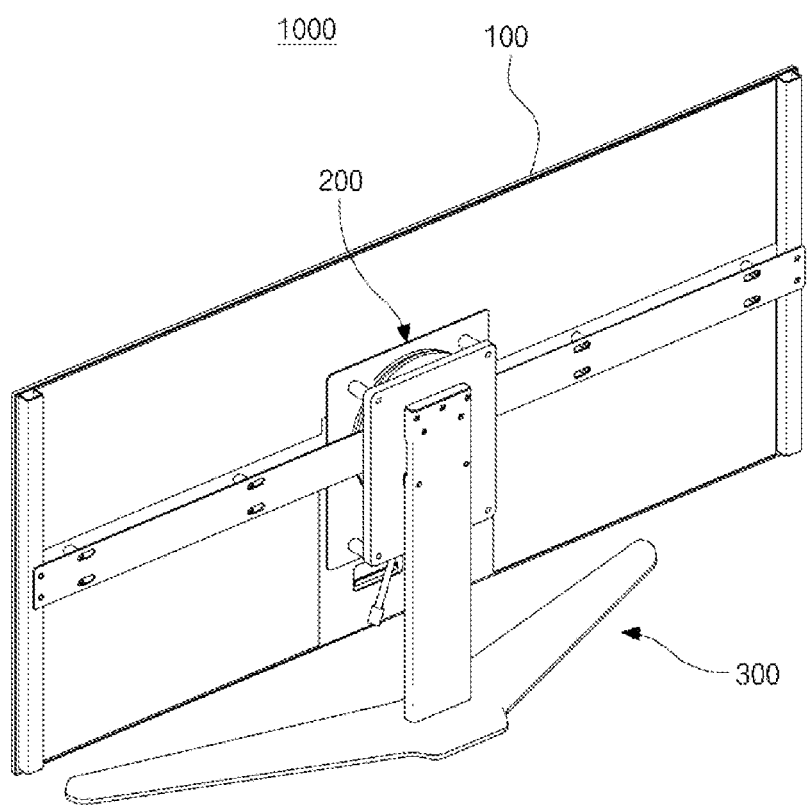
FIG. 3 is a view schematically illustrating a bendable display device according to an example embodiment of the present disclosure from the rear side.
Figure 4:
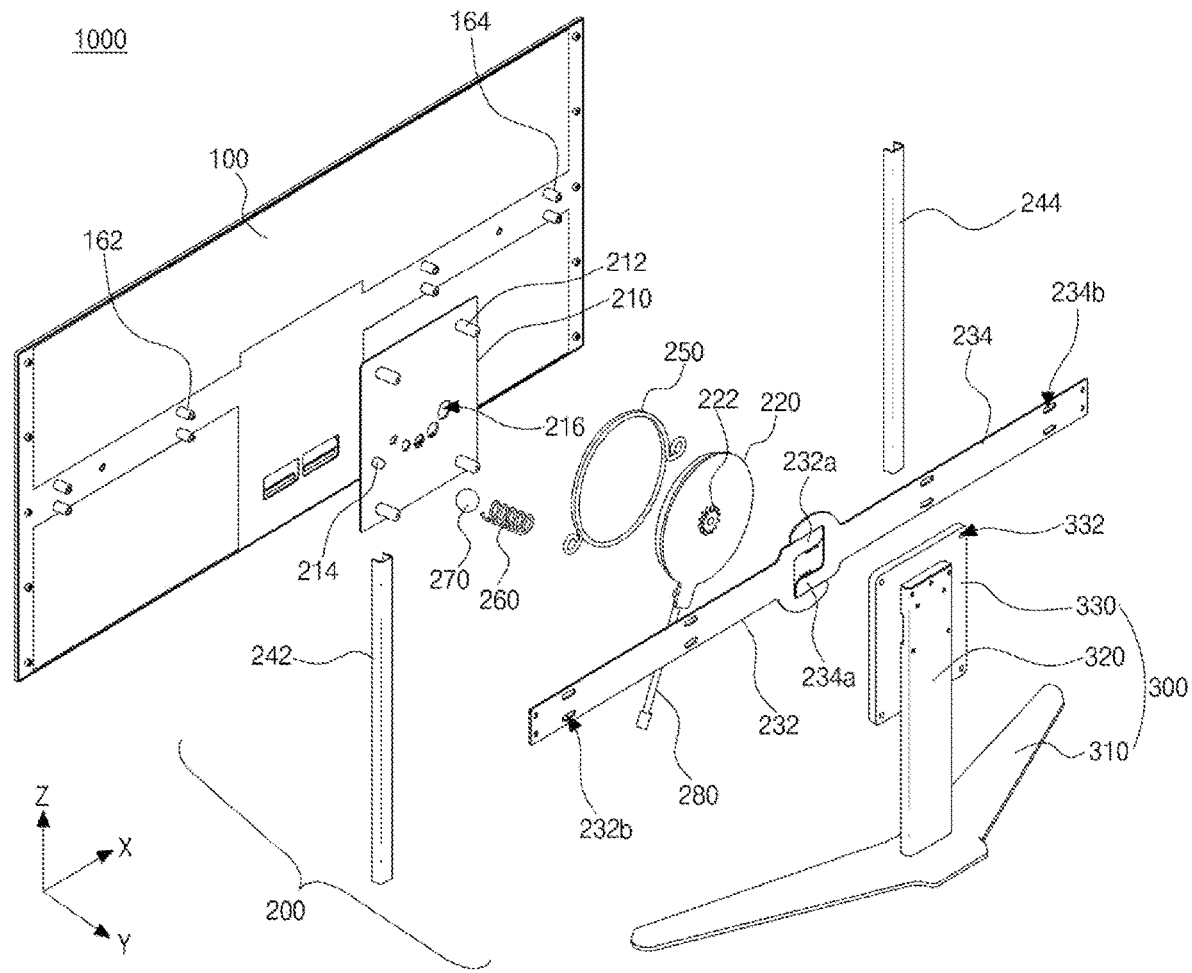
FIG. 4 is an exploded perspective view schematically illustrating a bendable display device according to an example embodiment of the present disclosure from the rear side.
Figure 5:
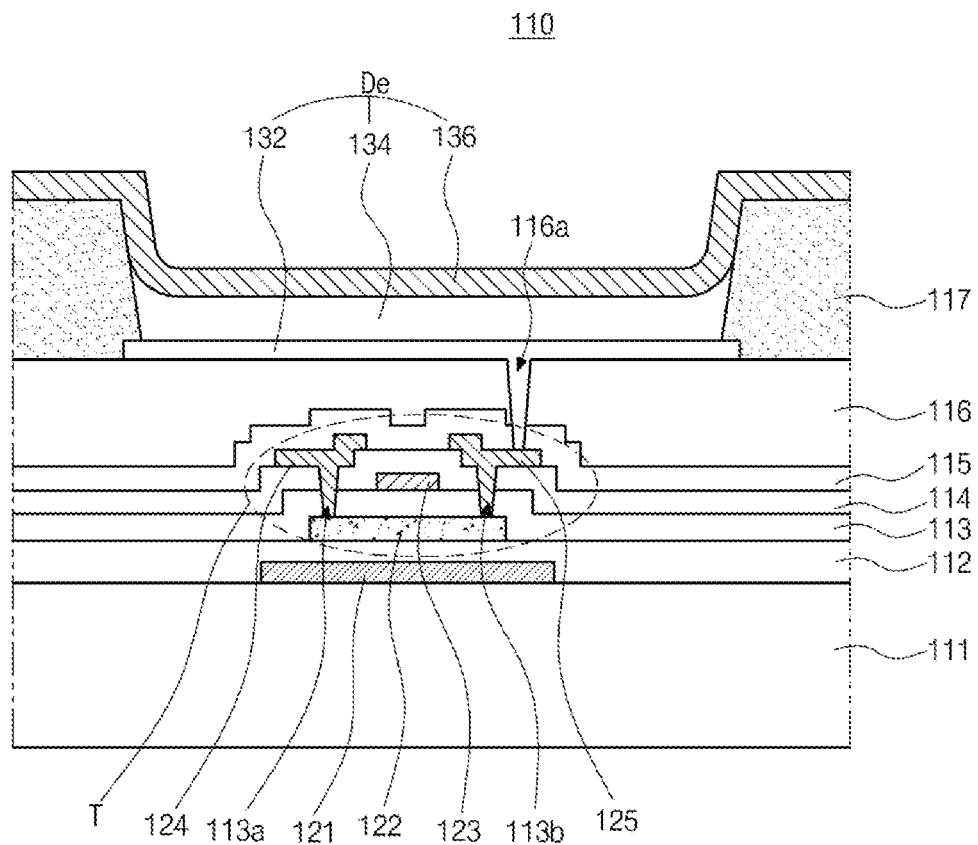
FIG. 5 is a schematic cross-sectional view of a display panel of a bendable display device according to an example embodiment of the present disclosure.

FIG. 3 is a view schematically illustrating a bendable display device according to an example embodiment of the present disclosure from the rear side, and FIG. 4 is an exploded perspective view schematically illustrating the bendable display device according to an example embodiment of the present disclosure from the rear side. FIGS. 3 and 4 show the bendable display device in the flat mode. In addition, FIG. 5 is a schematic cross-sectional view of a display panel of the bendable display device according to an example embodiment of the present disclosure and shows one pixel region.

In FIG. 3 and FIG. 4, the bendable display device 1000 according to an example embodiment of the present disclosure may include a display module 100, a bending system 200, and a holding system 300.

The display module 100 may include a display panel 110 displaying an image. In addition, although not shown in the figures, the display module 100 may further include a cover unit supporting and protecting the display panel 110. For example, the cover unit may include a middle cabinet and a back cover.

The display panel 110 may be an electroluminescent display device including a light-emitting diode and a thin film transistor.

Specifically, referring to FIG. 5, a shield pattern 121 of a conductive material, such as metal, may be formed on a substrate 111. The substrate 111 may be formed of a material having flexibility and may be a glass substrate or a plastic substrate. For example, polyimide may be used as the plastic substrate, but the embodiments of the present disclosure are not limited thereto.

The shield pattern 121 may be formed of at least one of aluminum (Al), copper (Cu), molybdenum (Mo), titanium (Ti), chromium (Cr), nickel (Ni), tungsten (W), and an alloy thereof and may have a single-layer or multiple-layer structure. For example, the shield pattern 121 may have a double-layer structure including a lower layer of molybdenum titanium (MoTi) and an upper layer of copper (Cu), and the upper layer may have a larger thickness than the lower layer.

A buffer layer 112 of an insulating material may be formed on the shield pattern 121. The buffer layer 112 may be disposed substantially on an entire surface of the substrate 111. The buffer layer 112 may be formed of an inorganic material, such as silicon oxide ($SiO_2$) or silicon nitride ($SiN_x$), and may include a single layer or multiple layers.

A semiconductor layer 122 may be formed on the buffer layer 112 and be patterned. The semiconductor layer 122 may be disposed to overlap the shield pattern 121. The semiconductor layer 122 may be formed of an oxide semiconductor material. In this case, the shield pattern 121 may block light incident on the semiconductor layer 122 and may help prevent the semiconductor layer 122 from deteriorating due to such incident light.

Alternatively, the semiconductor layer 122 may be formed of polycrystalline silicon, and both ends of the semiconductor layer 122 may be doped with impurities. In this case, the shield pattern 121 may be omitted.

A gate insulation layer 113 of an insulating material may formed on the semiconductor layer 122 substantially over the entire surface of the substrate 111. The gate insulation layer 113 may be formed of an inorganic insulating material, such as silicon oxide ($SiO_2$) or silicon nitride ($SiN_x$). If the semiconductor layer 122 is made of an oxide semiconductor material, the gate insulation layer 113 may be formed of silicon oxide ($SiO_2$) Alternatively, if the semiconductor layer 122 is made of polycrystalline silicon, the gate insulation layer 113 may be formed of silicon oxide ($SiO_2$) or silicon nitride ($SiN_x$).

A gate electrode 123 of a conductive material, such as metal, may be formed on the gate insulation layer 113 corresponding to the center of the semiconductor layer 122. The gate electrode 123 may be formed of at least one of aluminum (Al), copper (Cu), molybdenum (Mo), titanium (Ti), chromium (Cr), nickel (Ni), tungsten (W), and an alloy thereof and may have a single-layer or multiple-layer structure. For example, the gate electrode 123 may have a double-layer structure including a lower layer of molybdenum titanium (MoTi) and an upper layer of copper (Cu), and the upper layer may have a larger thickness than the lower layer.

In addition, although not shown in the figure, a gate line may be further formed on the gate insulation layer 113 through the same process as the gate electrode 123. The gate line may extend in a first direction and may be connected to the gate electrode 123.

In an example embodiment of the present disclosure, the gate insulation layer 113 may be formed substantially over the entire surface of the substrate 111. However, alternatively, the gate insulation layer 113 may be patterned to have the same shape as the gate electrode 123.

An interlayer insulation layer 114 made of an insulating material may be formed on the gate electrode 123 substantially over the entire surface of the substrate 111. The interlayer insulation layer 114 may be formed of an inorganic insulating material, such as silicon oxide ($SiO_2$) or silicon nitride ($SiN_x$). Alternatively, the interlayer insulation layer 114 may be formed of an organic insulating material, such as photo acryl or benzocyclobutene.

The interlayer insulation layer 114 may have first and second contact holes 113a and 113b respectively exposing a top surface of the semiconductor layer 122 near both ends. The first and second contact holes 113a and 113b may be disposed respectively at both sides of the gate electrode 123 and may be spaced apart from the gate electrode 123. The first and second contact holes 113a and 113b may also be formed in the gate insulation layer 113. Alternatively, if the gate insulation layer 113 is patterned to have the same shape as the gate electrode 123, the first and second contact holes 113a and 113b may be formed only in the interlayer insulation layer 114.

Source and drain electrodes 124 and 125 of a conductive material, such as metal, may be formed on the interlayer insulation layer 114. The source and drain electrodes 124 and 125 may be formed of at least one of aluminum (Al), copper (Cu), molybdenum (Mo), titanium (Ti), chromium (Cr), nickel (Ni), tungsten (W), and an alloy thereof and may have a single-layer or multiple-layer structure. For example, the source and drain electrodes 124 and 125 may have a double-layer structure including a lower layer of molybdenum titanium (MoTi) and an upper layer of copper (Cu), and the upper layer may have a larger thickness than the lower layer. Alternatively, the source and drain electrodes 124 and 125 may have a triple-layer structure.

In addition, although not shown in the figure, a data line and a power supply line may be further formed on the interlayer insulation layer 114 and may be formed through the same process as the source and drain electrodes 124 and 125.

The source and drain electrodes 124 and 125 may be spaced apart from each other with the gate electrode 123 positioned therebetween and may be in contact with both ends of the semiconductor layer 122 through the first and second contact holes 113a and 113b, respectively.

Although not shown in the figure, the data line may extend in a second direction and cross the gate line, thereby defining a pixel region. The power supply line for supplying a high potential voltage may be spaced apart from the data line.

The semiconductor layer 122, the gate electrode 123, and the source and drain electrodes 124 and 125 may form a thin film transistor T. The thin film transistor T may have a coplanar structure in which the gate electrode 123 and the source and drain electrodes 124 and 125 are located at the same side with respect to the semiconductor layer 122.

Alternatively, the thin film transistor T may have an inverted staggered structure in which the gate electrode and the source and drain electrodes are located at different sides with respect to the semiconductor layer. That is, the gate electrode may be disposed under the semiconductor layer, and the source and drain electrodes may be disposed over the semiconductor layer. The semiconductor layer may be formed of oxide semiconductor or amorphous silicon.

Meanwhile, one or more thin film transistors having substantially the same structure as the thin film transistor T can be further formed on the substrate 111.

A passivation layer 115 of an insulating material may be formed on the source and drain electrodes 124 and 125 substantially over the entire surface of the substrate 111. The passivation layer 115 may be formed of an inorganic insulating material, such as silicon oxide ($SiO_2$) or silicon nitride ($SiN_x$).

A planarization layer 116 of an insulating material may be formed on the passivation layer 115 substantially over the entire surface of the substrate 111. The planarization layer 116 may be formed of an organic insulating material, such as photo acryl or benzocyclobutene. The planarization layer 116 may have a flat top surface.

The planarization layer 116 and the passivation layer 115 may have a drain contact hole 116a exposing the drain electrode 125. The drain contact hole 116a may be spaced apart from the second contact hole 113b. Alternatively, the drain contact hole 116a may be disposed right over the second contact hole 113b.

A first electrode 132 may formed on the planarization layer 116 and may be formed of a conductive material having relatively high work function. The first electrode 132 may be disposed in the pixel region and be in contact with the drain electrode 125 through the drain contact hole 116a. For example, the first electrode 132 may be formed of a transparent conductive material, such as indium tin oxide (ITO) or indium zinc oxide (IZO), but is not limited thereto.

The electroluminescent display panel according to an example embodiment of the present disclosure may be a top emission type in which a light-emitting diode is configured to output light toward a direction away from the substrate 111. Accordingly, the first electrode 132 may further include a reflective electrode or a reflective layer, formed of a metal material having a relatively high reflectance, below the transparent conductive material. For example, the reflective electrode or reflective layer may be formed of an aluminum-palladium-copper (APC) alloy, silver (Ag), or aluminum (Al). The first electrode 132 may have a triple-layer structure of ITO/APC/ITO, ITO/Ag/ITO or ITO/Al/ITO, but is not limited thereto.

A bank 117 of an insulating material may be formed on the first electrode 132. The bank 117 may overlap and cover lateral edges of the first electrode 132 and may expose a central portion of the first electrode 132.

At least a top surface of the bank 117 may be hydrophobic, and a side surface of the bank 117 may be hydrophobic or hydrophilic. The bank 117 may be formed of an organic insulating material having a hydrophobic property. Alternatively, the bank 117 may be formed of an organic insulating material having a hydrophilic property and may be subjected to a hydrophobic treatment.

In an example embodiment of the present disclosure, the bank 117 may have a single structure including a single bank. However, the bank 117 may have a dual structure. That is, the bank 117 may have a dual structure including a hydrophilic bank of a lower portion and a hydrophobic bank of an upper portion.

Next, a light-emitting layer 134 may be formed on the first electrode 132 exposed through the bank 117.

Although not shown in the figure, the light-emitting layer 134 may include a first charge auxiliary layer, a light-emitting material layer, and a second charge auxiliary layer sequentially disposed over the first electrode 132. The light-emitting material layer may be formed of any one of red, green, and blue luminescent materials, but is not limited thereto. The luminescent material may be an organic luminescent material, such as a phosphorescent compound or a fluorescent compound, or may be an inorganic luminescent material, such as a quantum dot.

The first charge auxiliary layer may be a hole auxiliary layer, and the hole auxiliary layer may include at least one of a hole injecting layer (HIL) and a hole transporting layer (HTL). In addition, the second charge auxiliary layer may be an electron auxiliary layer, and the electron auxiliary layer may include at least one of an electron injecting layer (EIL) and an electron transporting layer (ETL). However, the present disclosure is not limited thereto.

The light-emitting layer 134 may be formed through a solution process or an evaporation process. If the light-emitting layer 134 is formed through the solution process, a height of the light-emitting layer 134 in the region adjacent to the bank 117 may rise higher closer to the bank 117.

A second electrode 136 of a conductive material having relatively low work function may be formed on the light-emitting layer 134 substantially over the entire surface of the substrate 111. The second electrode 136 may be formed of aluminum (Al), magnesium (Mg), silver (Ag), or an alloy thereof. The second electrode 136 may have a relatively small thickness such that light from the light-emitting layer 134 may be transmitted therethrough. Alternatively, the second electrode 136 may be formed of a transparent conductive material, such as indium-gallium-oxide (IGO), but is not limited thereto.

The first electrode 132, the light-emitting layer 134, and the second electrode 136 may constitute a light-emitting diode De. The first electrode 132 may serve as an anode, and the second electrode 136 may serve as a cathode, but the present disclosure is not limited thereto.

As described above, the electroluminescent display panel according to an example embodiment of the present disclosure may be a top emission type display panel in which light from the light-emitting layer 134 of the light-emitting diode De is output toward a direction away from the substrate 111, that is, output to the outside through the second electrode 136. The top emission type display panel may have a wider emission area than a bottom emission type display panel of the same size, to thereby improve luminance and reduce power consumption.

In addition, although not shown in the figure, an encapsulation layer may be formed on the second electrode 136 substantially over the entire surface of the substrate 111 to block moisture or oxygen introduced from the outside, thereby protecting the light-emitting diode De.

Referring to FIG. 3 and FIG. 4 again, a plurality of first bending guide pins 162 and a plurality of second bending guide pins 164 may be provided on a rear surface of the display module 100. Specifically, the first and second bending guide pins 162 and 164 may be disposed on a central portion of the display module 100 along a vertical direction, that is, a Z direction and may be spaced apart from each other along a horizontal direction, that is, an X direction. The first bending guide pins 162 may be disposed on the left side with respect to the center of the display module 100 along the X direction in the context of the figure, and the second bending guide pins 164 disposed on the right side. In each of the first and second bending guide pins 162 and 164, a pair of bending guide pins 162 or 164 spaced apart along the Z direction may be spaced apart from another pair at regular intervals along the X direction. Although it is illustrated that four first and second bending guide pins 162 and 164 are provided, respectively, but the present disclosure is not limited thereto. The number and arrangement of the first and second bending guide pins 162 and 164 may vary.

The first and second bending guide pins 162 and 164 may be engaged with first and second bending guide slots 232b and 234b of first and second horizontal bars 232 and 234, respectively, and may move horizontally along the X direction within the first and second bending guide slots 232b and 234b, respectively.

Next, the bending system 200 may be provided on the rear surface of the display module 100. The display module 100 may switch between the flat mode and the bended mode by operation of the bending system 200. In the bended mode, the display module 100 has the curvature along the X direction.

The bending system 200 may include a fixed plate 210, a rotating plate 220, and the first and second horizontal bars 232 and 234 sequentially disposed along a Y direction from the rear surface of the display module 100. In addition, the bending system 200 may further include first and second vertical bars 242 and 244 between the display module 100 and the first and second horizontal bars 232 and 234 and further include a tension member 250, a compression member 260, and a locking member 270 between the fixed plate 210 and the rotation plate 220.

The fixed plate 210, which is a bracket that connects the display module 100 and the holding system 300, may have a front surface fixed to the display module 100 and may include at least one nut socket 212 and at least one fixed protrusion 214 on its rear surface. In addition, the fixed plate 210 may further include at least one fixed hole 216.

The nut socket 212 may be combined with a nut hole 332 of a holder portion 330 of the holding system 300 by a screw. The fixed protrusion 214 may be connected to one end of the tension member 250. The fixed hole 216 may correspond to the compression member 260 and the locking member 270.

The rotating plate 220 may be disposed on the rear surface of the fixed plate 210. The rotating plate 220, which is a housing, may rotate with respect to the fixed plate 210. A pinion portion 222 may be provided on a rear surface of the rotating plate 220.

Meanwhile, a lever 280 may be connected to one side of the rotating plate 220. The lever 280 may rotate together with the rotating plate 220.

The first and second horizontal bars 232 and 234 may be disposed on the rear surface of the rotating plate 220. The first and second horizontal bars 232 and 234, which are curvature making bars, may extend along the X direction and cross a center of the rear surface of the display module 100 in the Z direction. The first and second horizontal bars 232 and 234 may be disposed on left and right sides of the center of the rear surface of the display module 100 in the X direction, respectively.

The first and second horizontal bars 232 and 234 may have first and second rack portions 232a and 234a at respective ends facing each other. The first and second rack portions 232a and 234a may be engaged with the pinion portion 222 to change a rectilinear motion into a rotational motion or a rotational motion into a rectilinear motion.

In addition, the first and second horizontal bars 232 and 234 may have a plurality of first and second bending guide slots 232b and 234b, respectively. Each of the first and second bending guide slots 232b and 234b may extend in the X direction. The first and second bending guide slots 232b and 234b may correspond to the first and second bending guide pins 162 and 164 of the display module 100, respectively.

Next, the first and second vertical bars 242 and 244 may be rigid bars and extend in the Z direction. Inner sides of the first and second vertical bars 242 and 244 may be fixed to left and right edges of the display module 100, respectively, and outer sides of the first and second vertical bars 242 and 244 may be fixed to other ends of the first and second horizontal bars 232 and 234, respectively. The first and second vertical bars 242 and 244 may be used to implement the curvature of upper and lower ends of the display module 100.

Next, the tension member 250, the compression member 260, and the locking member 270 may be provided substantially between the fixed plate 210 and the rotating plate 220.

The tension member 250 may be fixed to the fixed plate 210 and the rotating plate 220, and the tension of the tension member 250 may change due to the rotational motion of the rotating plate 220.

The compression member 260 and the locking member 270 may be disposed in a rotating depression provided on a front surface of the rotating plate 220 and may correspond to the fixed hole 216 of the fixed plate 210.

Next, the holding system 300 may be provided on a rear surface of the bending system 200. The holding system 300 may include a base portion 310, a stand portion 320, and the holder portion 330.

The base portion 310 is to support the components of the bendable display device 1000. The base portion 310 may be separated into two parts having a certain angle therebetween in the context of the figure, but is not limited thereto. Alternatively, the base portion 310 may be formed in a polygonal, circular, or elliptical plate shape.

The stand portion 320 may extend in the Z direction and may have a lower end fixed to the base portion 310 and an upper end fixed to the holder portion 330. The stand portion 320 may be configured to adjust a height of the display module 100 by changing the position of the holder portion 330 along the Z direction.

The holder portion 330 may have a substantially rectangular shape. The holder portion 330 may be fixed to an inner side of the stand portion 320, which faces the display modules 100, and may be combined with the fixed plate 210. The holder portion 330 may have the nut hole 332 at each corner corresponding to the nut socket 212 of the fixed plate 210. A screw may be united to the nut hole 332 of the holder portion 330 and the nut socket 212 of the fixed plate 210, so that the holder portion 330 can be combined with the fixed plate 210.

The configuration of the bending system of the bendable display device according to an example embodiment of the present disclosure will be described in detail with reference to FIGS. 6 to 10.

Figure 6:
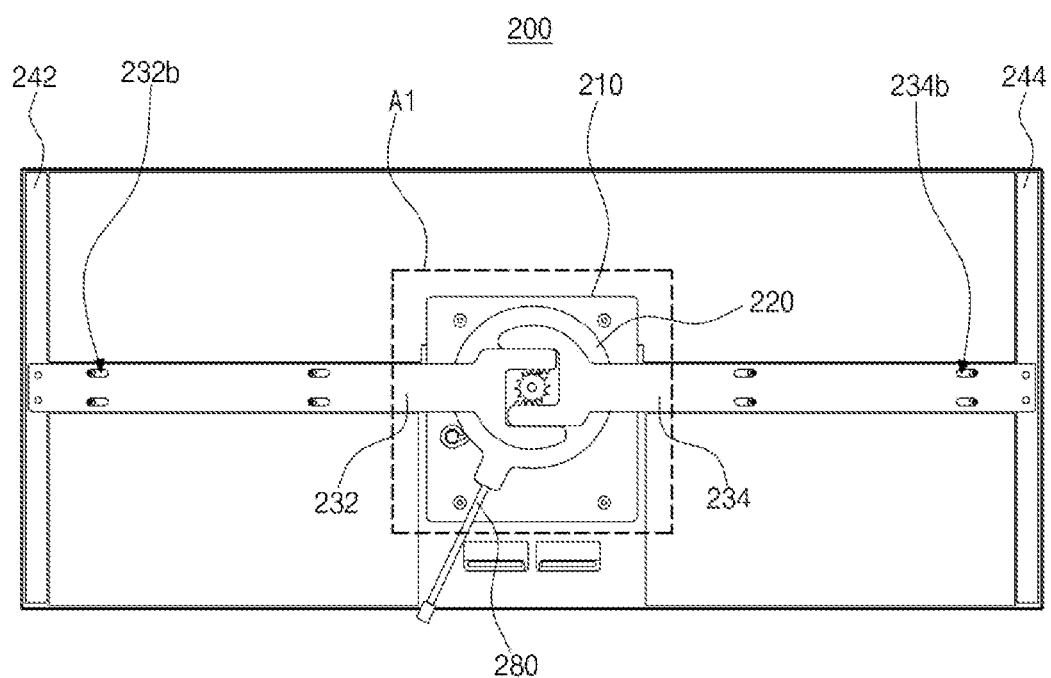
FIG. 6 is a view schematically illustrating a bending system of a bendable display device according to an example embodiment of the present disclosure.
Figure 7:
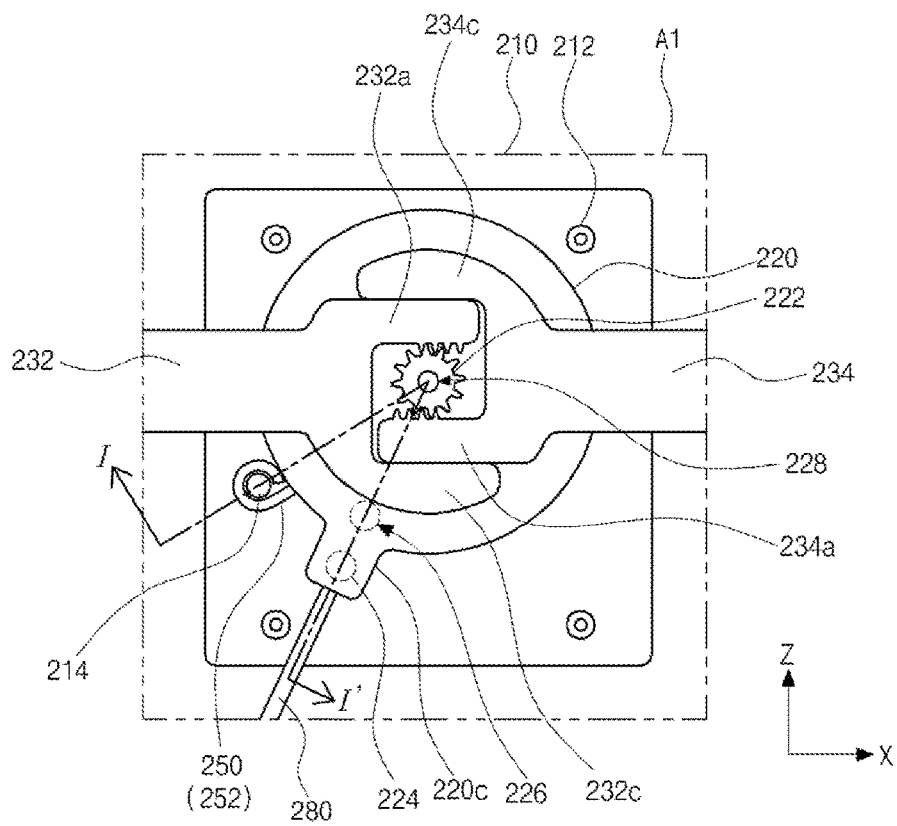
FIG. 7 is a schematically enlarged view of the area A1 of FIG. 6.
Figure 8:
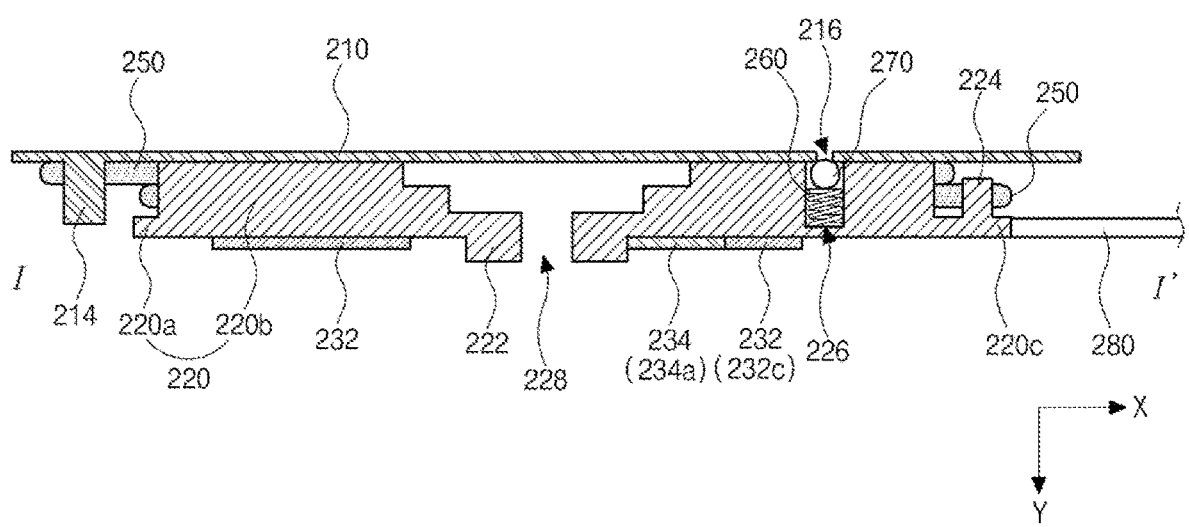
FIG. 8 is a schematic cross-sectional view taken along the line I-I' of FIG. 7.
Figure 9:
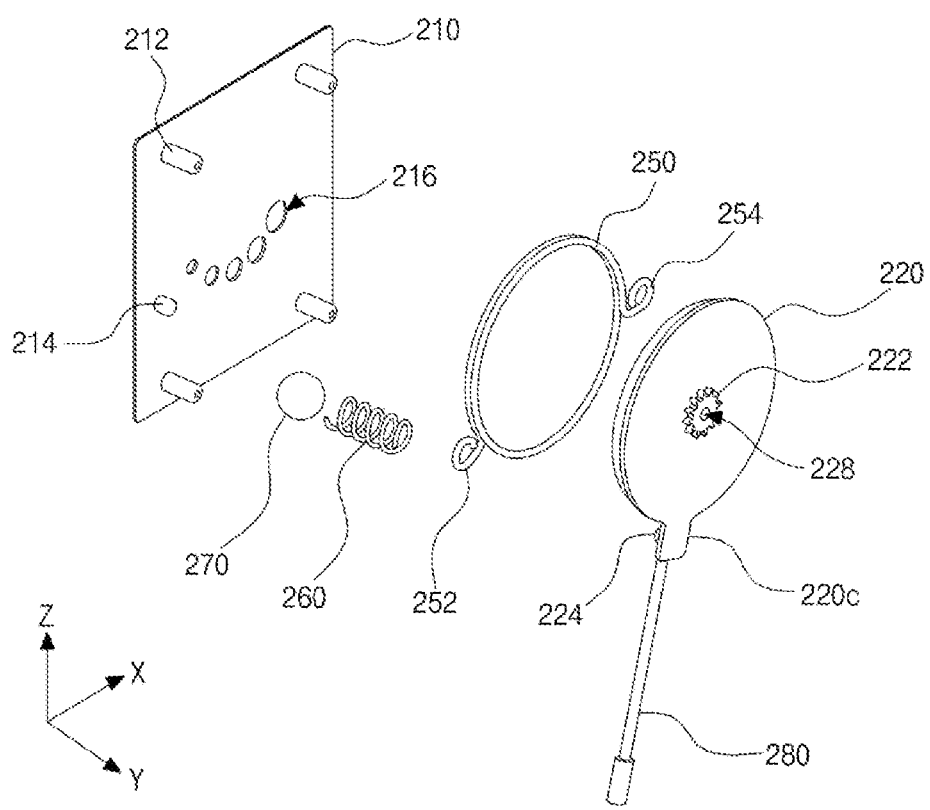
FIG. 9 is an exploded perspective view schematically illustrating a part of a bending system of a bendable display device according to an example embodiment of the present disclosure from the front side.
Figure 10:
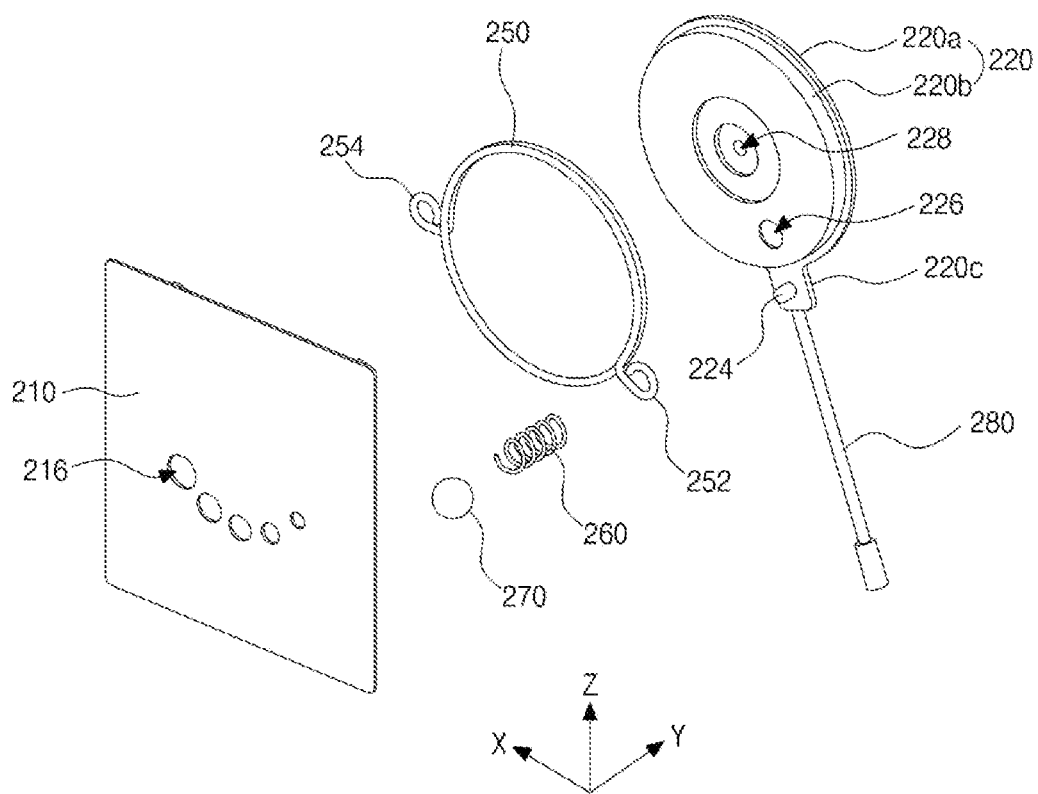
FIG. 10 is an exploded perspective view schematically illustrating a part of a bending system of a bendable display device according to an example embodiment of the present disclosure from the rear side.

FIG. 6 is a view schematically illustrating the bending system of the bendable display device according to an example embodiment of the present disclosure, FIG. 7 is an enlarged view of the area A1 of FIG. 6, and FIG. 8 is a cross-sectional view taken along the line I-I' of FIG. 7. In addition, FIG. 9 and FIG. 10 are views illustrating a part of the bending system of the bendable display device according to an example embodiment of the present disclosure. FIG. 9 is an exploded perspective view from the front side, and FIG. 10 is an exploded perspective view from the rear side. Here, FIGS. 6 to 10 show the bending system in the flat mode and will be described based on a direction viewed from the rear side.

In FIGS. 6 to 10, the bending system 200 according to an example embodiment of the present disclosure may include the fixed plate 210, the rotating plate 220, and the first and second horizontal bars 232 and 234. In addition, the bending system 200 according to an example embodiment of the present disclosure may further include the tension member 250, the compression member 260, and the locking member 270, and may further include the first and second vertical bars 242 and 244.

The fixed plate 210 may have a substantially rectangular shape, and four corners may be rounded. The fixed plate 210 may include the plurality of nut sockets 212 and one fixed protrusion 214 on the rear surface, which faces the rotating plate 220. In addition, the fixed plate 210 may further include the plurality of fixed holes 216.

The plurality of nut sockets 212 may extend and protrude toward the Y direction from the rear surface of the fixed plate 210. One nut socket 212 may be provided to correspond to each corner of the fixed plate 210. The nut sockets 212 may have a screw thread on an inner surface for fastening with the screw.

The fixed protrusion 214 may extend and protrude in the Y direction from the rear surface of the fixed plate 210 and may have a lower height than the nut sockets 212. The fixed protrusion 214 may be provided on the left side of the rear surface of the fixed plate 210 in the context of the figure and may be disposed substantially between the nut sockets 212 respectively corresponding to the upper and lower left corners of the fixed plate 210. However, the present disclosure is not limited thereto, and the fixed protrusion 214 may vary.

The plurality of fixed holes 216 may be disposed in the center of the fixed plate 210 substantially along the X direction and may be arranged in a downward convex circular arc shape. Here, a size of the plurality of fixed holes 216 may increase as the distance from the fixed protrusion 214 increase. Accordingly, the size of the plurality of fixed holes 216 may increase from left to right, that is, in a counterclockwise direction in the context of the figure. In other words, the diameter of the plurality of fixed holes 216 may increase in the counterclockwise direction. The plurality of fixed holes 216 may vary the intensity of the force required for the mode switching, thereby improving user convenience.

However, the present disclosure is not limited thereto, and the plurality of fixed holes 216 may have the same size, that is, the same diameter.

The rotating plate 220 on the rear surface of the fixed plate 210 may have a substantially circle shape and may rotate on the XZ plane with respect to the fixed plate 210. The rotating plate 220 may have the pinion portion 222 on the rear surface, which is a surface facing the first and second horizontal bars 232 and 234 and have a rotating protrusion 224 and a rotating depression 226 on the front surface, which is a surface facing the fixed plate 210. In addition, the rotating plate 220 may have a rotating hole 228 at the center.

The rotating plate 220 may include a first plate portion 220a and a second plate portion 220b. The second plate portion 220b may be disposed on a front surface of the first plate portion 220a, and the pinion portion 222 may be disposed on a rear surface of the first plate portion 220a. The first plate portion 220a may have a larger size than the second plate portion 220b, so that edges of the front surface of the first plate portion 220a may be exposed.

Further, the first plate portion 220a may have an extension part 220c at one side. The extension part 220c may extend from the first plate portion 220a on the XZ plane.

The rotating protrusion 224 may be disposed on a front surface of the extension part 220c. The rotating protrusion 224 may be spaced apart from the second plate portion 220b and may extend and protrude toward a −Y direction from the front surface of the extension part 220c.

Meanwhile, the lever 280 may be connected to the extension part 220c of the first plate portion 220a. However, the present disclosure is not limited thereto, and the position of the lever 280 may vary. The lever 280 may be a component for applying force and may rotate together with the rotating plate 220.

The rotating depression 226 may be provided in the second plate portion 220b. The rotating depression 226 may extend into the first plate portion 220a. The rotating depression 226 may be disposed between the rotating protrusion 224 and the rotating hole 228. However, the present disclosure is not limited thereto, and the position of the rotating depression 226 may vary.

The rotating hole 228 may be provided in the first and second plate portions 220a and 220b and the pinion portion 222. In this case, the size of the rotating hole 228 may decrease from the second plate portion 220b to the pinion portion 222. Accordingly, the diameter of the rotating hole 228 in the second plate portion 220b may be larger than the diameter of the rotating hole 228 in the pinion portion 222. However, the present disclosure is not limited thereto. Although not shown, a shaft, which serves as a rotation axis of the rotational motion of the rotating plate 220, may be provided in the rotating hole 228.

The first and second horizontal bars 232 and 234 on the rear surface of the rotating plate 220 may extend along the X direction and may be disposed substantially on left and right sides of the pinion portion 222, respectively. The first and second horizontal bars 232 and 234 may have the first and second rack portions 232a and 234a at the respective ends facing each other. The first and second rack portions 232a and 234a may extend substantially along the X direction and be spaced apart from each other along the Z direction. Each of the first and second rack portions 232a and 234a may have a plurality of teeth to be engaged with the pinion portion 222, and the pinion portion 222 may be disposed between the first and second rack portions 232a and 234a along the Z direction. In this case, the plurality of teeth may be provided in one side surfaces of the first and second rack portions 232a and 234a facing the pinion portion 222, and other side surfaces of the first and second rack portions 232a and 234a may be flat.

The pinion portion 222 and the first and second rack portions 232a and 234a may be engaged with each other to change a rectilinear motion into a rotational motion or a rotational motion into a rectilinear motion. Here, the pinion portion 222 may rotate in a clockwise direction or counterclockwise direction, and the first and second rack portions 232a and 234a may move linearly along the X direction.

For example, when the pinion portion 222 rotates in the clockwise direction, each of the first and second rack portions 232a and 234a moves horizontally in a direction toward the pinion portion 222. That is, the first rack portion 232a moves in the X direction, and the second rack portion 234a moves in a −X direction. On the other hand, when the pinion portion 222 rotates in the counterclockwise direction, each of the first and second rack portions 232a and 234a moves horizontally in a direction away from the pinion portion 222. That is, the first rack portion 232a moves in the −X direction, and the second rack portion 234a moves in the X direction.

Or, when each of the first and second rack portions 232a and 234a moves horizontally in the direction toward the pinion portion 222, the pinion portion 222 rotates in the clockwise direction. On the other hand, when each of the first and second rack portions 232a and 234a moves horizontally in the direction away from the pinion portion 222, the pinion portion 222 rotates in the counterclockwise direction.

Accordingly, by applying a force to one of the pinion portion 222 and the first and second rack portions 232a and 234a to move it, the rest may be moved.

In addition, the first and second horizontal bars 232 and 234 may further include first and second guide portions 232c and 234c at the respective ends facing each other. The first and second guide portions 232c and 234c may be spaced apart from the first and second rack portions 232a and 234a along the Z direction, respectively, and may have a substantially U-like shape together with the first and second rack portions 232a and 234a. Namely, each of the respective ends of the first and second horizontal bars 232 and 234 facing each other may have a U-like shape.

Here, the first and second rack portions 232a and 234a may be disposed between the first and second guide portions 232c and 234c, and the pinion portion 222 may be disposed between the first and second rack portions 232a and 234a. Accordingly, the first rack portion 232a may be disposed between the pinion portion 222 and the second guide portion 234c, and the second rack portion 234a may be disposed between the pinion portion 222 and the first guide portion 232c.

The first and second guide portions 232c and 234c may guide movement of the first and second rack portions 232a and 234a in the X direction and prevent the first and second rack portions 232a and 234a from moving in the Z direction.

Here, side surfaces of the first rack portion 232a and the second guide portion 234c facing each other may be substantially parallel to the X direction, and side surfaces of the second rack portion 234a and the first guide portion 232c facing each other may be substantially parallel to the X direction. The side surfaces of the first rack portion 232a and the second guide portion 234c and the side surfaces of the second rack portion 234a and the first guide portion 232c may be spaced apart from each other with a gap greater than 0 and equal to or less than 1 mm, preferably, greater than 0 and equal to or less than 0.1 mm, for precise control by minimizing component spacing. However, the present disclosure is not limited thereto. Alternatively, the side surfaces of the first rack portion 232a and the second guide portion 234c may be in contact with each other, and the side surfaces of the second rack portion 234a and the first guide portion 232c may be in contact with each other.

Meanwhile, as stated above, the first and second horizontal bars 232 and 234 may have the plurality of first and second bending guide slots 232b and 234b, respectively.

Next, the tension member 250 may be provided substantially between the fixed plate 210 and the rotating plate 220. The tension member 250 may be combined with the rotating plate 220 and may have a first end fixed to the fixed plate 210 and a second end fixed to the rotating plate 220. Specifically, the tension member 250 may surround a side surface of the second plate portion 220b of the rotating plate 220 and may have first and second loops 252 and 254 at the first and second ends, respectively. In this case, the first loop 252 may be fixed to the fixed protrusion 214 of the fixed plate 210, and the second loop 254 may be fixed to the rotating protrusion 224 of the rotating plate 220.

In the figure, the tension member 250 may have no tension, and the distance between the first and second loops 252 and 254 may be the maximum. However, in the flat mode and the curve mode, the tension member 250 may have tension, and in this case, the distance between the first and second loops 252 and 254 may be smaller than shown.

The tension member 250 may improve shaking of the display module 100 of FIG. 3 in the flat mode to secure rigidity. Specifically, in the display module 100 of FIG. 3 in the flat mode, internal stress may be removed, and shaking may occur. However, in the present disclosure, the tension member 250 may be provided, so that the tension of the tension member 250 in the flat mode can be maximized and the tension member 250 in the bended mode may have a specific level of tension. Here, the tension of the tension member 250 in the flat mode may be greater than the tension of the tension member 250 in the bended mode. Accordingly, by always applying stress to the display module 100 of FIG. 3, vibration of the display module 100 of FIG. 3 can be prevented or minimized.

In addition, when switching from the flat mode to the bended mode, the tension member 250 may reduce the linear tension and support the torque to facilitate the mode switching. For example, the tension member 250 may be a torsion spring. However, the present disclosure is not limited thereto.

Alternatively, the tension member 250 can be applied as long as it has a configuration capable of applying tension. For example, the tension member 250 may be implemented by at least two compression springs. In this case, one ends of the compression springs may be fixed to the rotating plate 220, and other ends of the compression springs may be fixed to the first and second horizontal bars 232 and 234, respectively. The tension may be changed by the rotational motion of the rotating plate 220 and the rectilinear motion of the first and second horizontal bars 232 and 234.

Next, the compression member 260 and the locking member 270 may be provided substantially between the fixed plate 210 and the rotating plate 220. The compression member 260 and the locking member 270 may be disposed in the rotating depression 226.

The compression member 260 and the locking member 270 may correspond to the fixed holes 216 of the fixed plate 210. Accordingly, the rotating depression 226 of the rotating plate 220 may correspond to the fixed holes 216 of the fixed plate 210.

In this case, the locking member 270 may be disposed between the compression member 260 and the fixed plate 210, and part of the locking portion 270 may be disposed in one of the fixed holes 216. The compression member 260 may apply a force to the locking member 270 toward the fixed plate 210, so that the locking member 270 can maintain a stopped position in one fixed hole 216. Accordingly, the locking member 270 may be seated in one fixed hole 216 until an additional force is applied, thereby stopping the mode switching and maintain the seated state.

The compression member 260 may have a compression force that can withstand a reaction force at a curvature of up to 800R.

Here, the size of the fixed holes 216 may be smaller than the size of the locking member 270. Specifically, the diameter of the largest fixed hole 216 may be smaller than the diameter of the locking member 270. The sizes of the fixed holes 216 and the locking member 270 may be configured to withstand a reaction force in the bended mode and may be configured to withstand the reaction force at a curvature of up to 800R.

For example, the compression member 260 may be a compression spring. In addition, the locking member 270 may be a spherical object, that is, a ball. However, the present disclosure is not limited thereto.

The fixed holes 216, the rotating depression 226, the compression member 260, and the locking member 270 may constitute a stopper structure that can stop the mode switching of the display module 100 of FIG. 3 step by step, that is, change the curvature of the display module 100 of FIG. 3 step by step. In this case, the curvature of the display module 100 of FIG. 3 can be precisely controlled according to the number and interval of the fixed holes 216.

Implementation of the flat mode and the bended mode of the bendable display device by the bending system 200 will be described in detail with reference to FIGS. 11 to 14.

Figure 11:
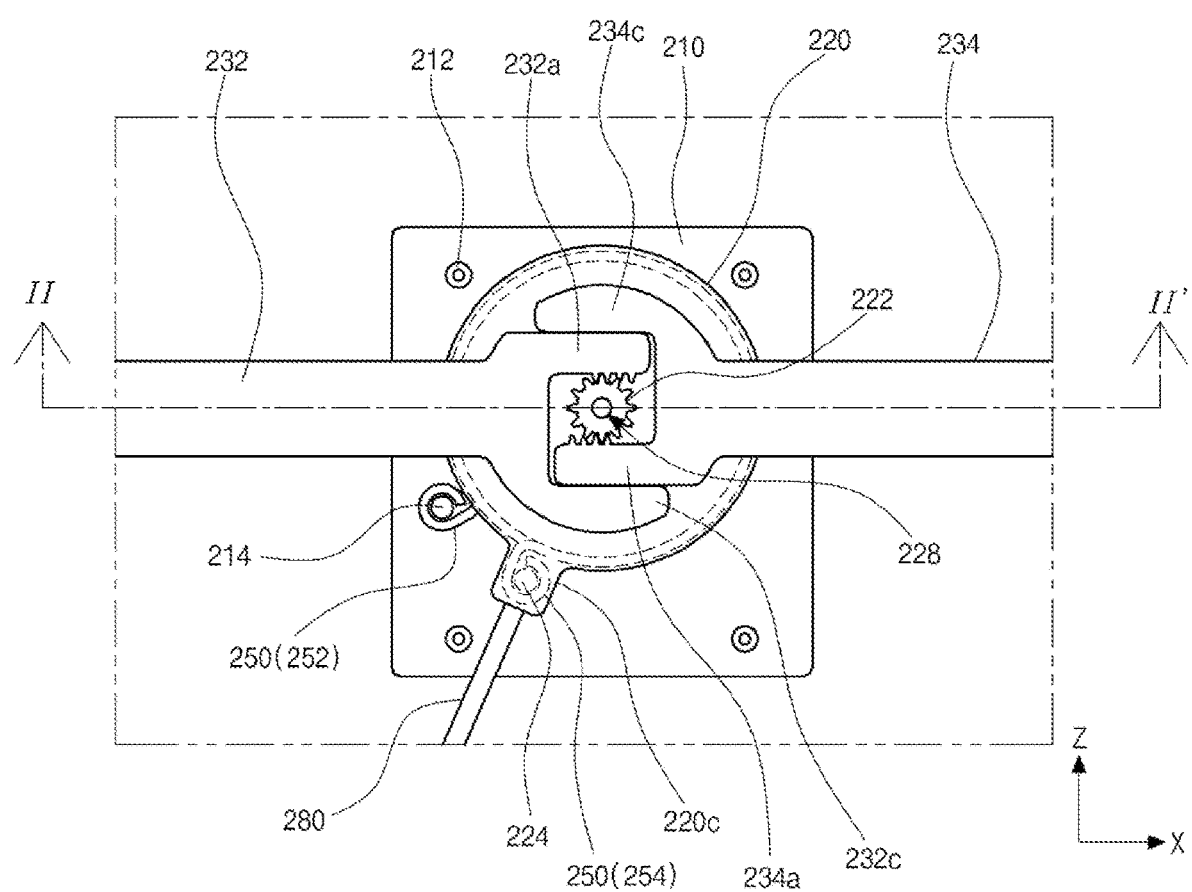
FIG. 11 is a view schematically illustrating a bendable display device in a flat mode according to an example embodiment of the present disclosure.
Figure 12:
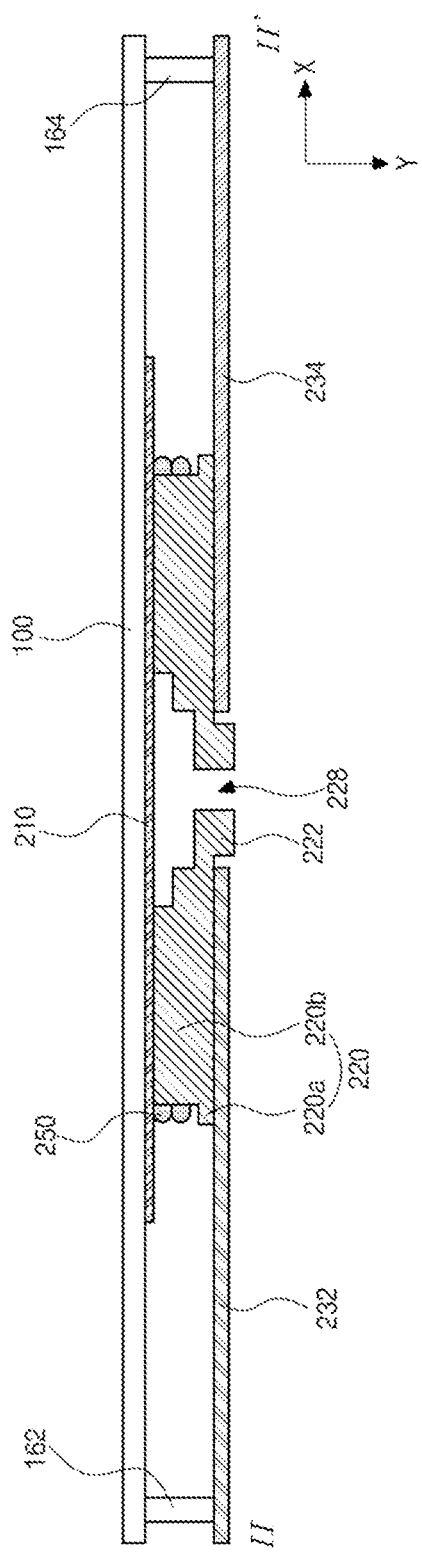
FIG. 12 is a schematic cross-sectional view taken along the line II-IP of FIG. 11.
Figure 13:
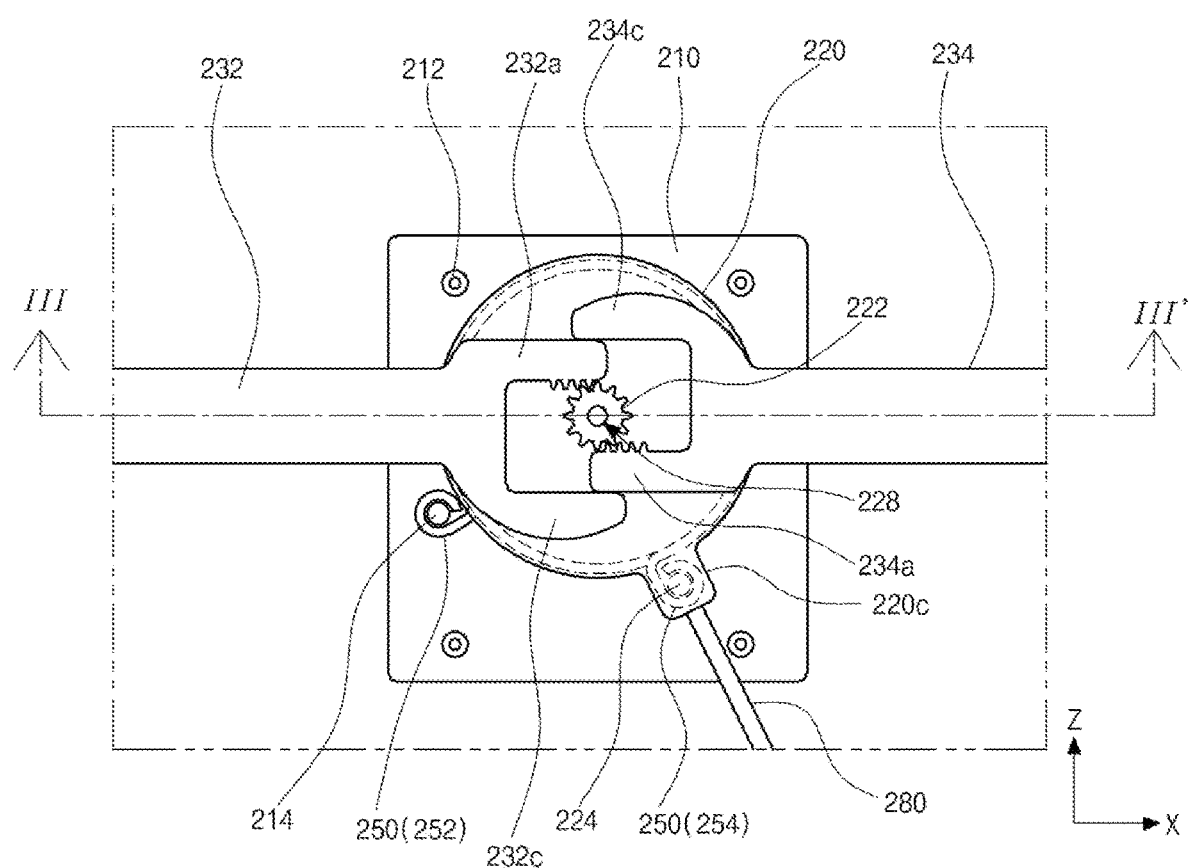
FIG. 13 is a view schematically illustrating a bendable display device in a bended mode according to an example embodiment of the present disclosure.
Figure 14:
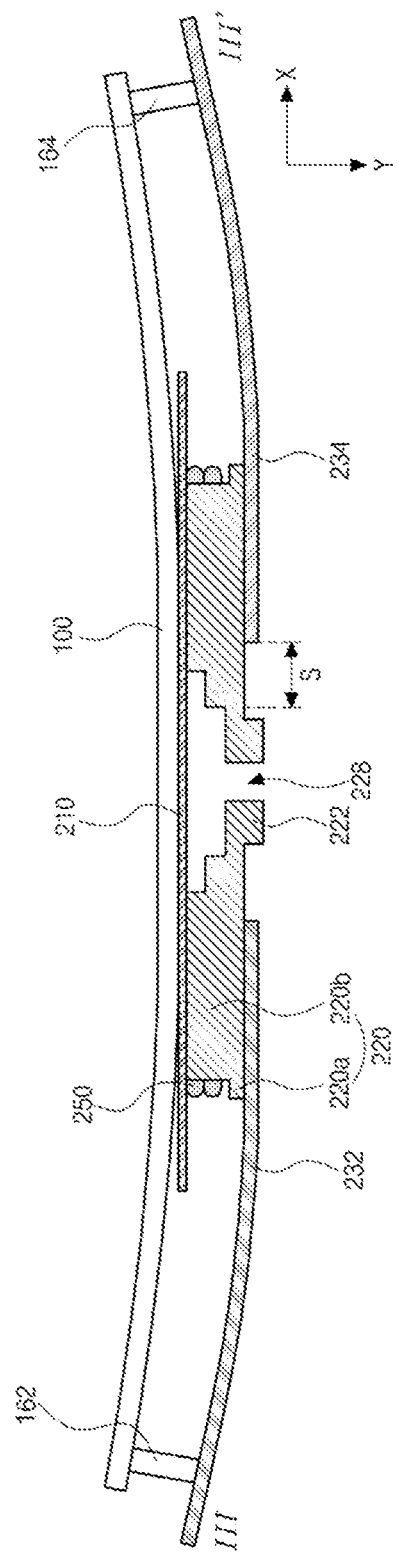
FIG. 14 is a schematic cross-sectional view taken along the line III-III' of FIG. 13.

FIG. 11 is a view schematically illustrating a bendable display device in a flat mode according to an example embodiment of the present disclosure, FIG. 12 is a cross-sectional view taken along the line II-IP of FIG. 11, FIG. 13 is a view schematically illustrating a bendable display device in a bended mode according to an example embodiment of the present disclosure, and FIG. 14 is a cross-sectional view taken along the line III-III' of FIG. 13.

First, as shown in FIGS. 11 and 12, in the flat mode, a distance between one ends of the first and second horizontal bars 232 and 234 facing each other may be minimized, and a distance between the first and second loops 252 and 254 of the tension member 250 may be short. In this case, the extension part 220c of the rotating plate 220 and the lever 280 may be disposed substantially on the left side of the rear surface of the display module 100. Accordingly, the first and second horizontal bars 232 and 234 may be parallel to the XZ plane, and the display module 100 may also be parallel to the XZ plane to thereby be in a flat state.

Next, by rotating the lever 280 and the rotating plate 220 in the counterclockwise direction, as shown in FIGS. 13 and 14, the extension part 220c of the rotating plate 220 and the lever 280 may be disposed substantially on the right side of the rear surface of the display module 100. Accordingly, the pinion portion 222 of the rotating plate 220 may also rotate in the counterclockwise direction, and each of the first and second rack portions 232a and 234a may move horizontally in a direction away from the pinion portion 222. Therefore, the distance between the one ends of the first and second horizontal bars 232 and 234 facing each other may be maximized, and the distance between the first and second loops 252 and 254 of the tension member 250 may be increased.

Here, since the other ends of the first and second horizontal bars 232 and 234 are fixed to left and right edges of the display module 100, respectively, the compression force may be applied to the left and right edges of the display module 100 by the stroke S induced by the movement of the first and second rack portions 232a and 234a, and the left and right edges of the display module 100 may be bent in the −Y direction, so that the display module 100 can be in the bended state.

At this time, the locking member 270 of FIG. 8 is locked into one fixed hole 216 of FIG. 8 with a force capable of overcoming the reaction force, so that the display module 100 can maintain the bended state.

On the other hand, when switching the bended mode of FIGS. 13 and 14 into the flat mode of FIGS. 11 and 12, the components of the bendable display device according to an example embodiment of the present disclosure may move in an opposite direction to the above-mentioned direction.

Here, it is described that the first and second horizontal bars 232 and 234 linearly move by the rotational movement of the pinion portion 222, but the present disclosure is not limited thereto. Alternatively, the pinion portion 222 may be rotated by the linear movement of the first and second horizontal bars 232 and 234.

Meanwhile, as stated above, in the bendable display device according to an example embodiment of the present disclosure, by the tension member 250, the shaking of the display module 100 in the flat mode can be prevented or minimized, and the mode switching can be facilitated. This will be described with reference to FIGS. 15 and 16.

Figure 15:
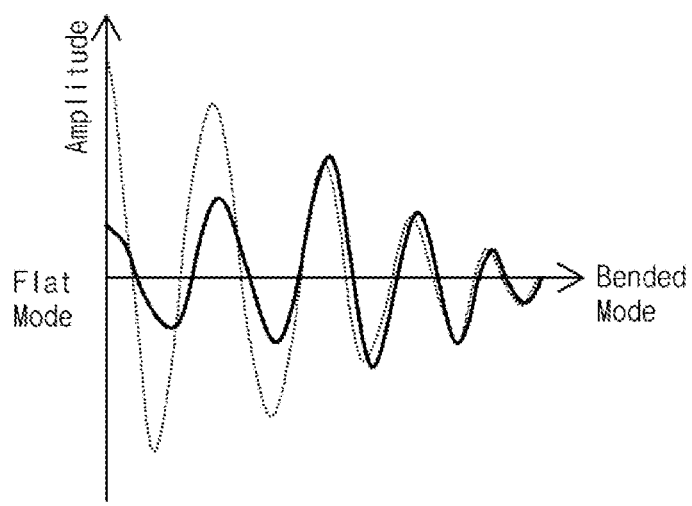
FIG. 15 is a graph schematically showing amplitude due to shaking of a display module of a bendable display device according to an example embodiment of the present disclosure in a flat mode and a bended mode.
Figure 16:
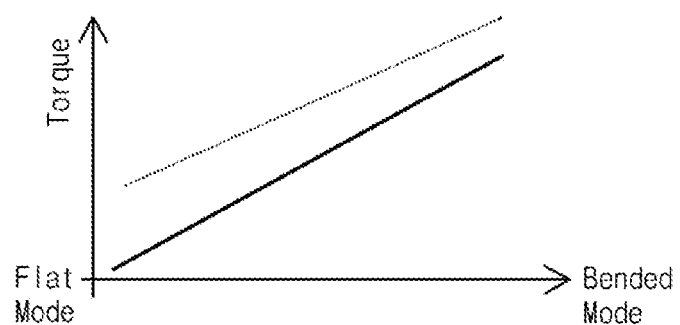
FIG. 16 is a graph schematically showing torque applied to a display module of a bendable display device according to an example embodiment of the present disclosure in a flat mode and a bended mode.

FIG. 15 is a graph schematically showing amplitude due to shaking of a display module of a bendable display device according to an example embodiment of the present disclosure in a flat mode and a bended mode, and FIG. 16 is a graph schematically showing torque applied to a display module of a bendable display device according to an example embodiment of the present disclosure in a flat mode and a bended mode. A comparative example is shown together. Here, the solid line corresponds to the example embodiment, and the dashed line corresponds to the comparative example.

As shown in FIG. 15, in the example embodiment of the present disclosure, by maximizing the tension of the tension member 250 in the flat mode, stress may be always applied to the display module 100, so that the shaking of the display module 100 can be minimized in the flat mode. Accordingly, compared to the comparative example, the amplitude due to the shaking can be significantly reduced.

Additionally, in the example embodiment of the present disclosure, the tension member 250 may have a specific level of tension in the bended mode, and the linear tension may be decreased in the process of switching from the flat mode into the bended mode, thereby supporting the torque when changing the mode. Accordingly, as shown in FIG. 16, compared to the comparative example, the torque required in the flat mode and the bended mode may be reduced, and it is possible to switch between the flat mode and the bended mode with a smaller force, so that it is easy to switch the mode.

The bendable display device according to an example embodiment of the present disclosure can switch the modes using both the grip method and the non-grip method. These will be described in detail with reference to FIGS. 17A and 17B and FIGS. 18A and 18B.

Figure 17A:
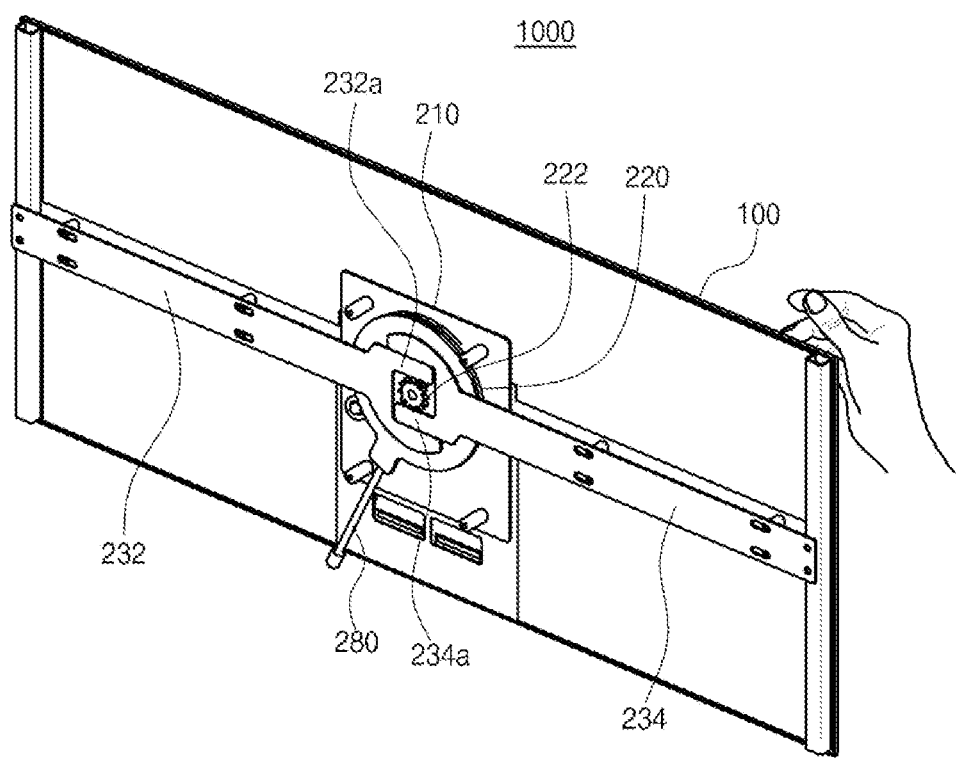
FIGS. 17A and 17B are views schematically illustrating the mode switching of a bendable display device according to an example embodiment of the present disclosure using a grip method.
Figure 17B:
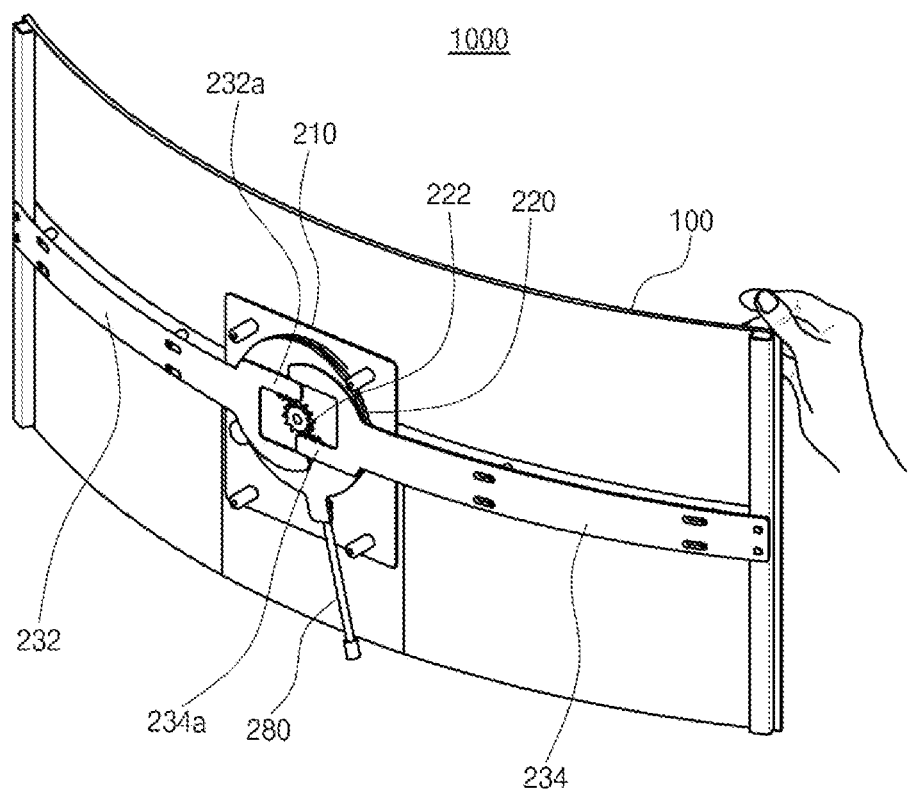

FIGS. 17A and 17B are views schematically illustrating the mode switching of a bendable display device according to an example embodiment of the present disclosure using a grip method. FIG. 17A shows a bendable display device in a flat mode, and FIG. 17B shows a bendable display device in a bended mode.

As shown in FIG. 17A, by holding the right upper end of the display module 100 in the flat mode with a hand and applying a force in a front direction which the front surface of the display module 100 faces, the second rack portion 234a of the second horizontal bar 234 may move horizontally toward the right edge of the display module 100, and the pinion portion 222 may rotate in the counterclockwise direction due to the horizontal movement of the second rack portion 234a. Accordingly, the first rack portion 232a of the first horizontal bar 232 may move horizontally toward the left edge of the display module 100.

Therefore, as shown in FIG. 17B, the one ends of the first and second horizontal bars 232 and 234 facing each other may move away from the pinion portion 222, and the display module 100 may be in the bended mode. In this case, by the rotation of the pinion portion 222, the lever 280 connected to the rotating plate 220 may also be rotated in the counterclockwise direction, and the lever 280, which is disposed on the left side of the rear surface of the display module 100 in the flat mode, may be disposed on the right side of the rear surface of the display module 100.

On the other hand, when switching from the bended mode to the flat mode, the force may be applied to the display module 100 of FIG. 17B in the bended mode in a rear direction which the rear surface of the display module 100 faces, the display module 100 may be in the flat mode of FIG. 17A. Each component of the bendable display device 1000 according to an example embodiment of the present disclosure may move in an opposite direction to the above-mentioned direction.

In FIGS. 17A and 17B, the right upper end of the display module 100 may be held with a hand and the force may be applied. However, the present disclosure is not limited thereto. Alternatively, the left upper end of the display module 100 may be held with a hand and the force may be applied, the left and right upper ends of the display module 100 may be held with hands and the force may be applied, or the centers of the left and right edges of the display module 100 may be held with hands and the force may be applied.

Figure 18A:
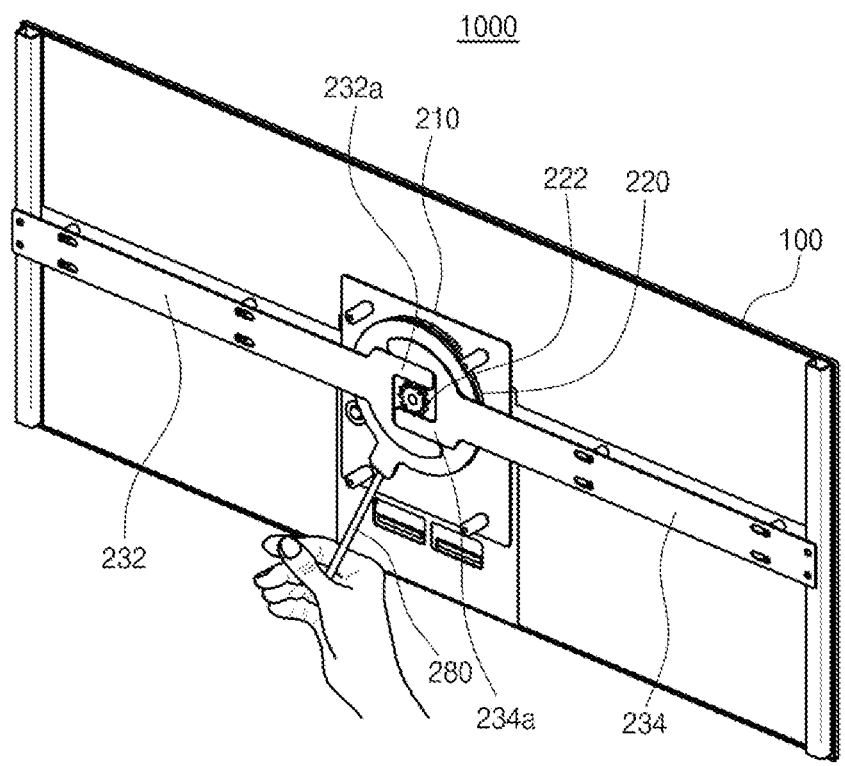
FIGS. 18A and 18B are views schematically illustrating the mode switching of a bendable display device according to an example embodiment of the present disclosure using a non-grip method.
Figure 18B:
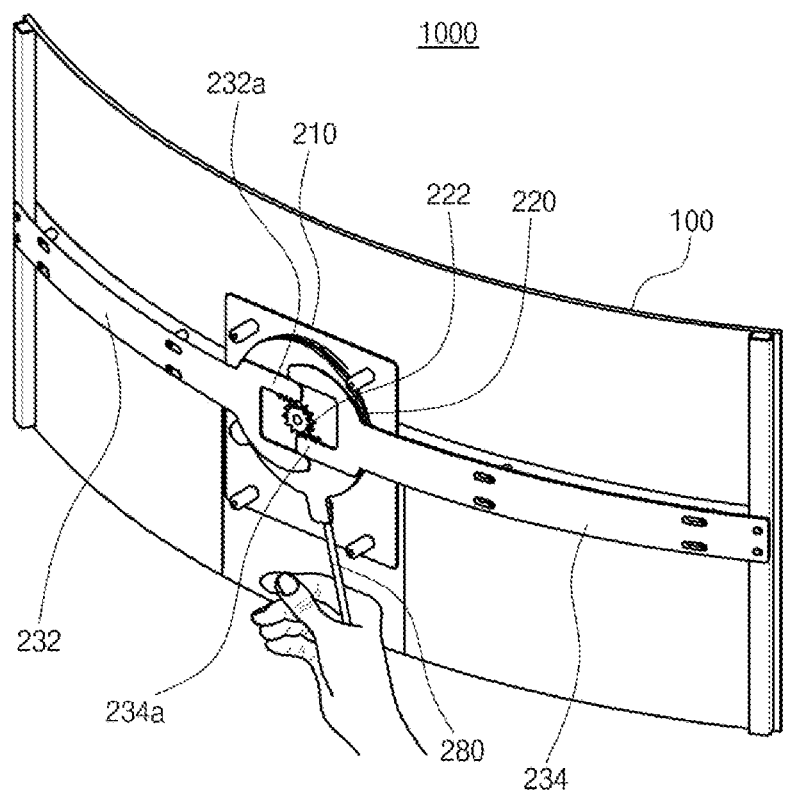

FIGS. 18A and 18B are views schematically illustrating the mode switching of a bendable display device according to an example embodiment of the present disclosure using a non-grip method. FIG. 18A shows a bendable display device in a flat mode, and FIG. 18B shows a bendable display device in a bended mode.

As shown in FIG. 18A, by holding the lever 280 disposed on the left side of the rear surface of the display module 100 in the flat mode with a hand and applying a force to the right, the lever 280 may be rotated in the counterclockwise direction. Accordingly, the rotating plate 220 connected to the lever 280 may rotate in the counterclockwise direction, and the pinion portion 222 of the rotating plate 220 may also rotate. In this case, the first and second rack portions 232a and 234a engaged with the pinion portion 222 may move horizontally toward the left and right edges of the display module 100, respectively.

Therefore, as shown in FIG. 18B, the one ends of the first and second horizontal bars 232 and 234 facing each other may move away from the pinion portion 222, and the display module 100 may be in the bended mode. In this case, the lever 280 may be disposed on the right side of the rear surface of the display module 100.

On the other hand, when switching from the bended mode to the flat mode, by holding the lever 280 of FIG. 18B with a hand and applying a force to the left side, the lever 280 may be rotated in the clockwise direction. Accordingly, each component of the bendable display device 1000 according to an example embodiment of the present disclosure may move in an opposite direction to the above-mentioned direction, and the display module 100 may be in the flat mode of FIG. 18A.

As described above, in the bendable display device 1000 according to an example embodiment of the present disclosure, the bending system 200 including the first and second rack portions 232a and 234a and the pinion portion 222 may be provided, so that it is possible to selectively apply the grip method and the non-grip method when switching the modes.

In the bendable display device according to the present disclosure, by applying a bending system including two rack portions and one pinion portion, the grip method and the non-grip method can be selectively applied when switching the modes of the display module, thereby increasing the convenience. Accordingly, problems in each of the grip method and the non-grip method can be improved.

In addition, by applying a tension member, the shaking of the display module in the flat mode can be improved, and the mode switching can be facilitated.

Further, by providing the stopper structure, it is possible to maintain the flat state and the bended state of the display module, and the curvature can be adjusted step by step.

It will be apparent to those skilled in the art that various modifications and variations can be made in the display device of the present disclosure without departing from the technical idea or scope of the disclosure. Thus, it is intended that embodiments of the present disclosure cover the modifications and variations of the disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A bendable display device, comprising:
    a display module; and
    a bending system on a rear surface of the display module and configured to change the display module between a flat mode and a bended mode,
    wherein the bending system includes a fixed plate, a rotating plate, and first and second horizontal bars,
    wherein the rotating plate has a pinion portion, and
    wherein the first and second horizontal bars have first and second rack portions engaged with the pinion portion at one ends thereof, respectively;
    wherein the bending system further includes a tension member connected to the fixed plate and the rotating plate,
    wherein a tension of the tension member in the flat mode is greater than a tension of the tension member in the bended mode;
    wherein the fixed plate includes a fixed protrusion connected to a first end of the tension member, and wherein the rotating plate includes a rotating protrusion connected to a second end of the tension member; and
    wherein a distance between the first and second ends of the tension member in the flat mode is shorter than a distance between the first and second ends of the tension member in the bended mode.

2. The bendable display device of claim 1,
    wherein the tension member is a torsion spring.

3. The bendable display device of claim 1, wherein the bending system further includes a compression member and a locking member,
    wherein the fixed plate includes at least one fixed hole, and the rotating plate has a rotating depression, and
    wherein the compression member and the locking member are disposed in the rotating depression, and part of the locking member is disposed in the at least one fixed hole.

4. The bendable display device of claim 3, wherein the fixed plate includes a plurality of fixed holes, and
wherein sizes of the plurality of fixed holes are smaller than a size of the locking member.

5. The bendable display device of claim 3, wherein the compression member is a compression spring, and the locking member is a spherical object.

6. The bendable display device of claim 1, wherein the bending system further includes a lever connected to the rotating plate.

7. The bendable display device of claim 1, wherein the bending system further includes first and second vertical bars, and
wherein inner sides of the first and second vertical bars are fixed to left and right edges of the display module, respectively, and outer sides of the first and second vertical bars are fixed to other ends of the first and second horizontal bars, respectively.

8. The bendable display device of claim 1, wherein the first and second horizontal bars further include first and second guide portions at the one ends, respectively, and wherein the first rack portion is disposed between the pinion portion and the second guide portion, and the second rack portion is disposed between the pinion portion and the first guide portion.

9. The bendable display device of claim 8, wherein each of the one ends of the first and second horizontal bars has a U-like shape.

10. The bendable display device of claim 1, further comprising:
a holding system provided on a rear surface of the bending system by being combined with the fixed plate, and configured to support the bendable display device and to adjust a height of the display module.

11. The bendable display device of claim 1, wherein the first and second horizontal bars are linearly moved in opposite directions by rotation of the pinion portion; and wherein the pinion portion is rotated by linear movement of the first and second horizontal bars in opposite directions.

* * * * *